(12) United States Patent
Matsubara

(10) Patent No.: US 8,102,053 B2
(45) Date of Patent: Jan. 24, 2012

(54) DISPLACEMENT DETECTION PATTERN FOR DETECTING DISPLACEMENT BETWEEN WIRING AND VIA PLUG, DISPLACEMENT DETECTION METHOD, AND SEMICONDUCTOR DEVICE

(75) Inventor: Yoshihisa Matsubara, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 788 days.

(21) Appl. No.: 12/078,936

(22) Filed: Apr. 8, 2008

(65) Prior Publication Data
US 2008/0252306 A1 Oct. 16, 2008

(30) Foreign Application Priority Data
Apr. 16, 2007 (JP) .................. 2007-107340

(51) Int. Cl.
*H01L 29/76* (2006.01)

(52) U.S. Cl. ......................................... 257/758; 257/48

(58) Field of Classification Search .................. 257/758, 257/48
See application file for complete search history.

(56) References Cited

U.S. PATENT DOCUMENTS

| | | | | |
|---|---|---|---|---|
| 5,717,251 A * | 2/1998 | Hayashi et al. | ............... | 257/758 |
| 5,760,429 A * | 6/1998 | Yano et al. | ................... | 257/211 |
| 5,891,799 A * | 4/1999 | Tsui | .............................. | 438/624 |
| 5,895,239 A * | 4/1999 | Jeng et al. | ..................... | 438/239 |
| 5,935,766 A * | 8/1999 | Cheek et al. | .................. | 430/316 |
| 6,130,449 A * | 10/2000 | Matsuoka et al. | ............ | 257/296 |
| 6,603,203 B2 * | 8/2003 | Amanuma | .................... | 257/758 |
| 6,657,280 B1 * | 12/2003 | Hulvey et al. | ................. | 257/578 |
| 6,710,441 B2 * | 3/2004 | Eden et al. | ..................... | 257/698 |
| 6,734,477 B2 * | 5/2004 | Moise et al. | ................... | 257/295 |
| 6,770,535 B2 * | 8/2004 | Yamada et al. | ............... | 438/270 |
| 6,791,134 B2 * | 9/2004 | Kimura et al. | ................ | 257/296 |
| 6,924,206 B2 * | 8/2005 | Ozawa | .......................... | 438/387 |
| 7,220,600 B2 * | 5/2007 | Summerfelt et al. | ............ | 438/3 |
| 7,242,094 B2 * | 7/2007 | Matsunaga et al. | ........... | 257/758 |
| 7,667,291 B2 * | 2/2010 | Kim | ............................. | 257/530 |
| 2004/0188842 A1 * | 9/2004 | Takewaka et al. | ............ | 257/758 |

FOREIGN PATENT DOCUMENTS
JP 62-86741 4/1987

\* cited by examiner

*Primary Examiner* — Eugene Lee
(74) *Attorney, Agent, or Firm* — McGinn IP Law Group, PLLC

(57) ABSTRACT

A displacement detection pattern, usable for detection of a relative displacement between a wiring and a via plug, includes a wiring provided between via plugs and a conductor. The conductor is provided in the same layer level as a level at which the wiring is provided and is provided at a predetermined distance from the wiring.

6 Claims, 15 Drawing Sheets

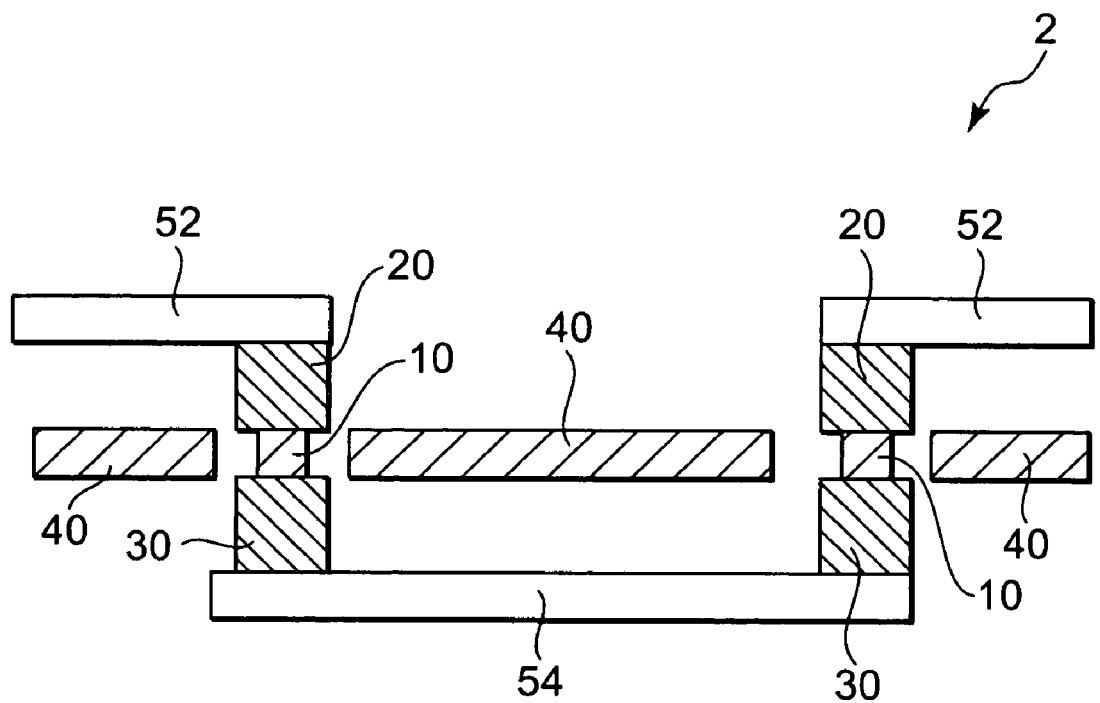

DISPLACEMENT DETECTION PATTERN FOR DETECTING DISPLACEMENT BETWEEN WIRING AND VIA PLUG, DISPLACEMENT DETECTION METHOD, AND SEMICONDUCTOR DEVICE

BACKGROUND OF THE INVENTION

1. Field of the Invention

The present invention relates to a displacement detection pattern, a displacement detection method, and a semiconductor device.

2. Description of Related Art

FIG. 15 is a plan view illustrating a displacement detection pattern described in Japanese Laid-Open Patent Application Publication No. Sho 62-86741.

A displacement detection pattern 100 is provided with film electrodes 102 and film electrodes 104. The film electrodes 102 are formed on a substrate prior to the formation of a pattern to be tested for detection of a displacement. Meanwhile, the thin electrodes 104 are formed at the same time as the formation of the pattern. The thin electrodes 102 and 104 are each arranged at a constant pitch. It should be noted that the pitch between the thin electrodes 102 and the pitch between the thin electrodes 104 are different.

In such a configuration, the thin electrodes 102 and the thin electrodes 104 inevitably come in contact with each other at some point. At such contact point, electrical continuity is established between the thin electrode 102 and the thin electrode 104. Accordingly, a displacement in a pattern of wiring and the like can be detected by examining which thin electrodes 102 and 104 have the electrical continuity therebetween.

According to the displacement detection pattern 100 described above, it is possible to detect an absolute displacement of a wiring, that is, a displacement of a wiring in respect to a substrate. However, a relative displacement between a wiring and a via plug cannot be detected.

SUMMARY OF THE INVENTION

A displacement detection pattern is a pattern that is used for detection of a relative displacement between a wiring and a via plug. The displacement detection includes a wiring provided between via plugs and a conductor. The conductor is provided with the same layer level with a level at which the wiring is provided and is provided a predetermined distance from the wiring.

When a relative displacement exists between the wiring and the via plugs, the area of a contact surface between the via plugs and the wiring or the conductor changes. Such a change in the area appears as a change in electric resistance of a pathway including the contact surface. Accordingly, a relative displacement between the wiring and the via plugs can be detected by measuring the electric resistance.

According to the aspect of the present invention, a displacement detection pattern which is suitable for detection of a relative displacement between a wiring and a via plug can be provided.

BRIEF DESCRIPTION OF THE DRAWINGS

The above and other exemplary aspects, advantages and features of the present invention will be more apparent from the following description of certain exemplary embodiments taken in conjunction with the accompanying drawings, in which:

FIG. 7 is a cross-sectional view illustrating a second exemplary embodiment of the displacement detection pattern according to the present invention;

DETAILED DESCRIPTION OF THE EXEMPLARY EMBODIMENTS

First Exemplary Embodiment

Figure 1:
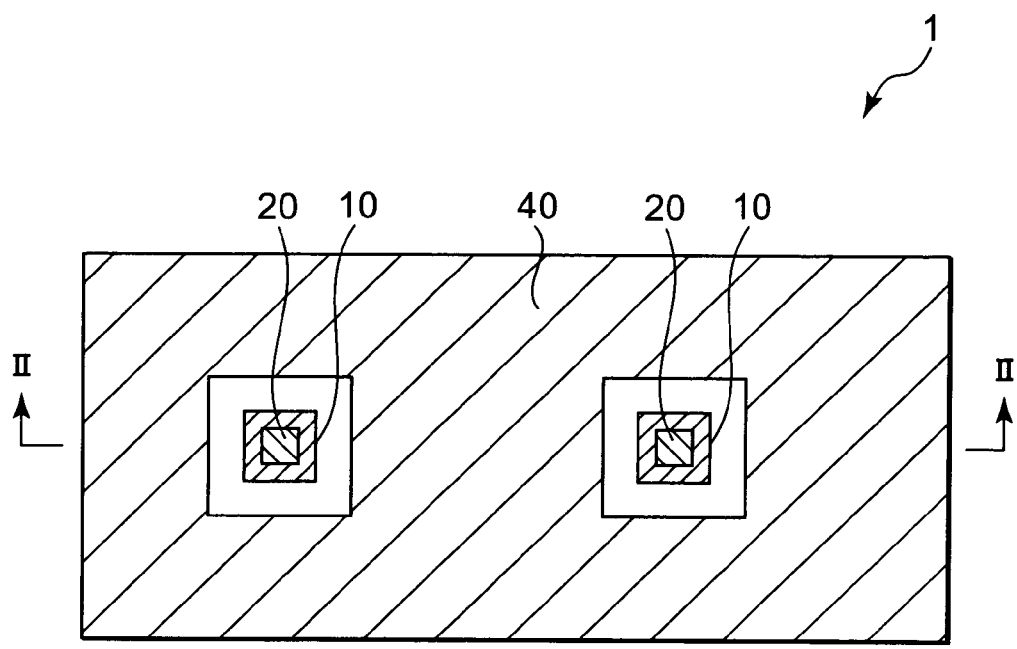
FIG. 1 is a plan view illustrating a first exemplary embodiment of the displacement detection pattern according to the present invention.
Figure 2:
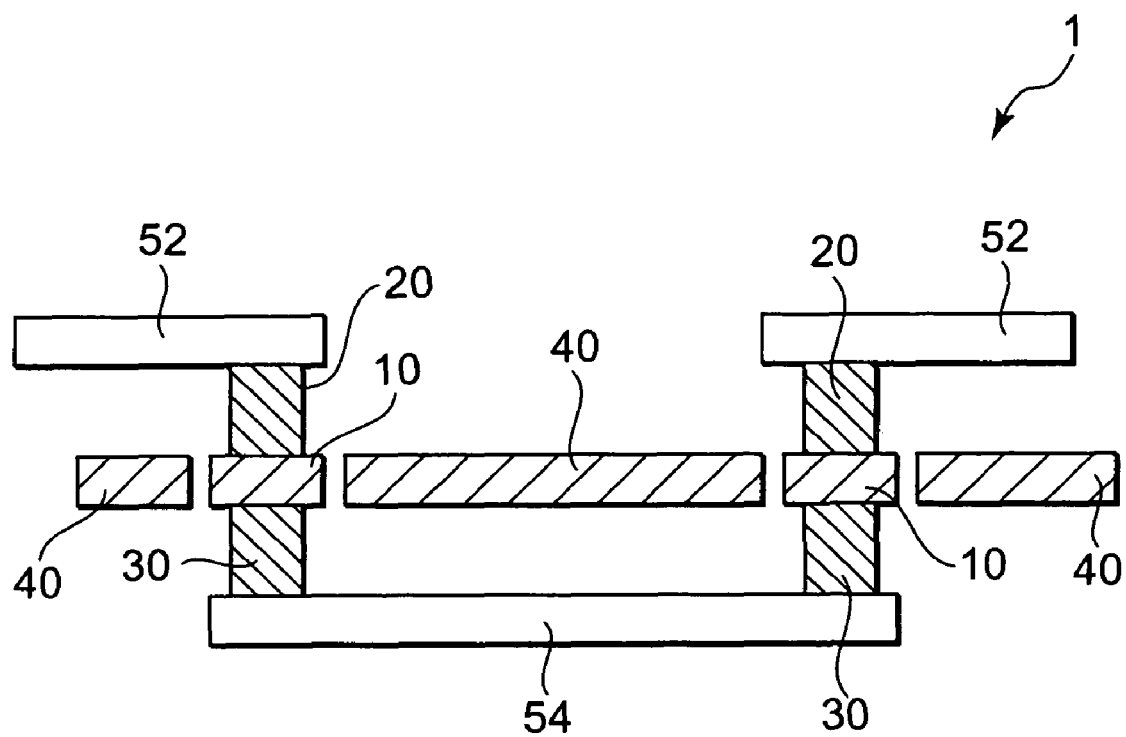
FIG. 2 is a cross-sectional view taken along a line II-II of FIG. 1.

FIG. 1 is a plan view illustrating a first exemplary embodiment of the displacement detection pattern according to the present invention. FIG. 2 is a cross-sectional view taken along a line II-II of FIG. 1. A displacement detection pattern 1 is a pattern used for detection of a relative displacement between a wiring and a via plug. A wiring 10, a via plug 20 (a first via plug), a via plug 30 (a second via plug), and a conductor 40 are provided in the pattern. The wiring 10, the via plug 20, the via plug 30, and the conductor 40 are, for example, made of copper. It should be noted that FIGS. 1 and 2 illustrate the status where such a displacement does not exist.

The via plug 20 and the via plug 30 are connected to the upper surface (a first surface) and the lower surface (a second surface) of the wiring 10, respectively. When the displacement described above does not exist, the via plugs 20 and 30 are provided at positions overlapping each other in a planar view. Furthermore, in this configuration, the gravity center of the wiring 10 is located at the same position as the gravity centers of the via plugs 20 and 30. In the present embodiment, the area of the wiring 10 is larger than the areas of the via plugs 20 and 30 in a planar view.

In the same layer in which the wiring 10 is provided, the conductor 40 is provided a predetermined distance from the wiring 10. As shown in FIG. 1, the conductor 40 surrounds the wiring 10. In other words, the wiring 10 is configured to be located within an opening of the conductor 40. When the displacement described above does not exist, the distance between the wiring 10 and the conductor 40 is constant.

A wiring 52 is connected to the upper surface of the via plug 20. Meanwhile, a wiring 54 is connected to the lower surface of the via plug 30. These wirings 52 and 54 are made of, for example, copper. It should be noted that the wirings 52 and 54 are not shown in FIG. 1.

The wiring 10 and the conductor 40 described above are formed, for example, in the same layer in which an M2 wiring (a wiring in the second bottom layer) is formed in a semiconductor device provided with the displacement detection pattern 1. In such a case, the wiring 10 and the conductor 40 are formed at the same time as the formation of the M2 wiring by, for example, a Damascene method. Especially when a dual Damascene method is used, the via plug 30 is also formed at the same time as the formation of the wiring 10, the conductor 40, and the M2 wiring. It is preferable that the wiring 10 be a wiring having the minimum area (minimum-area wiring) among wirings provided in the semiconductor device. In the meantime, it is preferable that the distance between the wiring 10 and the conductor 40 be equal to the minimum distance (minimum-wiring distance) between the wirings provided in the semiconductor device.

In the semiconductor device, the wiring 52 and the wiring 54 are, for example, formed in the same layers in which an M3 wiring (a wiring in the third bottom layer) and an M1 wiring (a wiring in the bottom layer) are formed, respectively. In such a case, the wiring 52 and the wiring 54 are formed at the same time as the formation of the M3 wiring and the M1 wiring, respectively, by, for example, a Damascene method. Especially when a dual Damascene method is used, the via plug 20 is also formed at the same time as the formation of the wiring 52 and the M3 wiring.

Figure 3A:
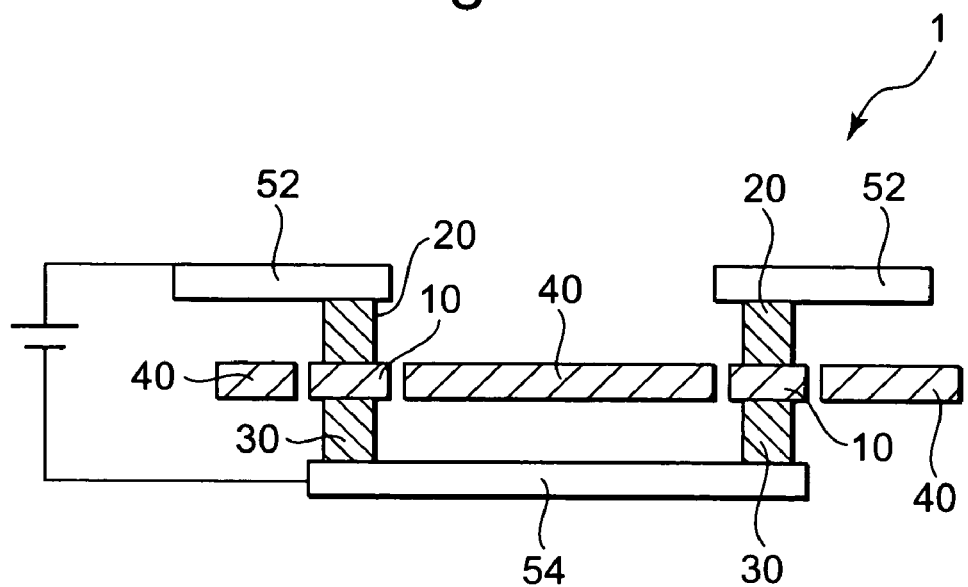
FIGS. 3A and 3B are cross-sectional views for describing a displacement detection method in the first exemplary embodiment.

Next, as a part of the embodiment of the displacement detection method of the present invention, a performance example of the displacement detection pattern 1 will be described. Firstly, a displacement detection method in an open check is described by referring to FIGS. 3A and 3B. This method includes a step of applying a voltage between the via plug 20 and the via plug 30 as shown in FIG. 3A. To be more specific, a voltage is applied between terminals (not shown in the figure) which are each connected to the wirings 52 and 54. In this configuration, electric resistance of the pathway including contact surfaces between the wiring 10 and the via plugs 20 and 30 is measured.

Figure 3B:
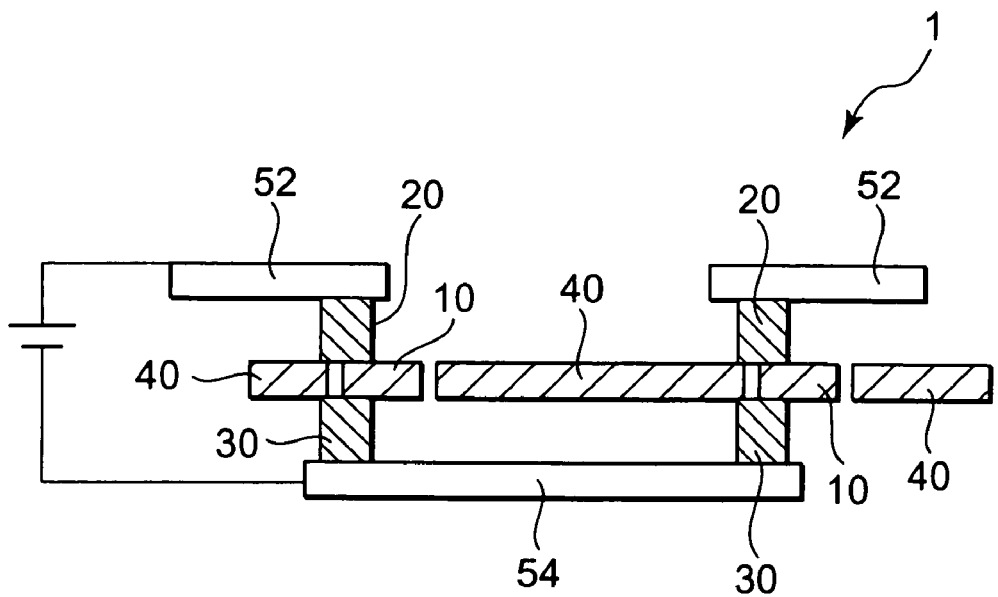

In the case where a relative displacement between the wiring 10 and the via plugs 20 and 30 exists as shown in FIG. 3B, the area of the above-described contact surfaces becomes smaller. Such a change in the area appears as a change in the above-described electric resistance. Therefore, it is possible to electrically detect a relative displacement between the wiring and the via plugs by measuring such electric resistance.

Figure 4A:
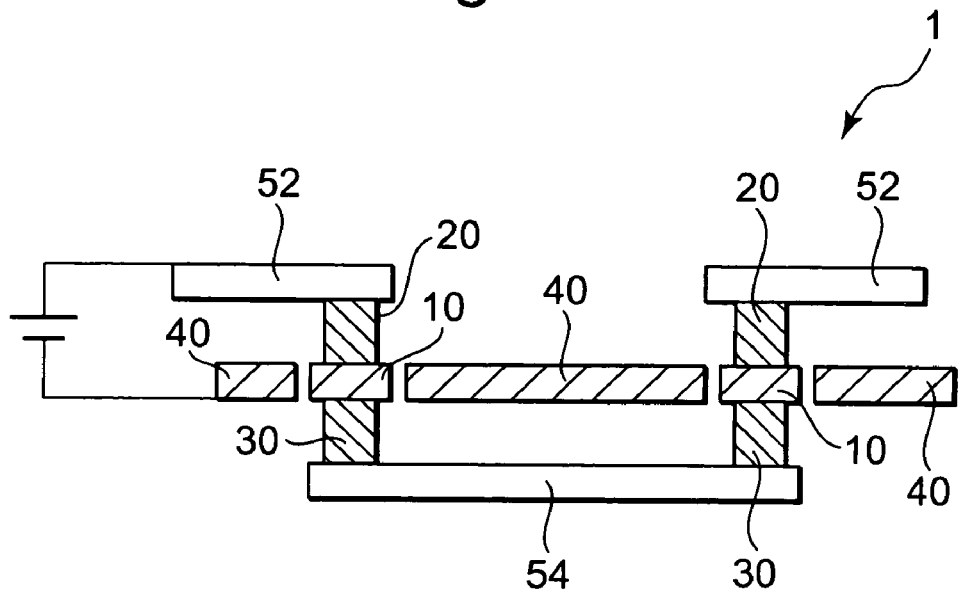
FIGS. 4A and 4B are cross-sectional views for describing the displacement detection method in the first exemplary embodiment.
Figure 4B:
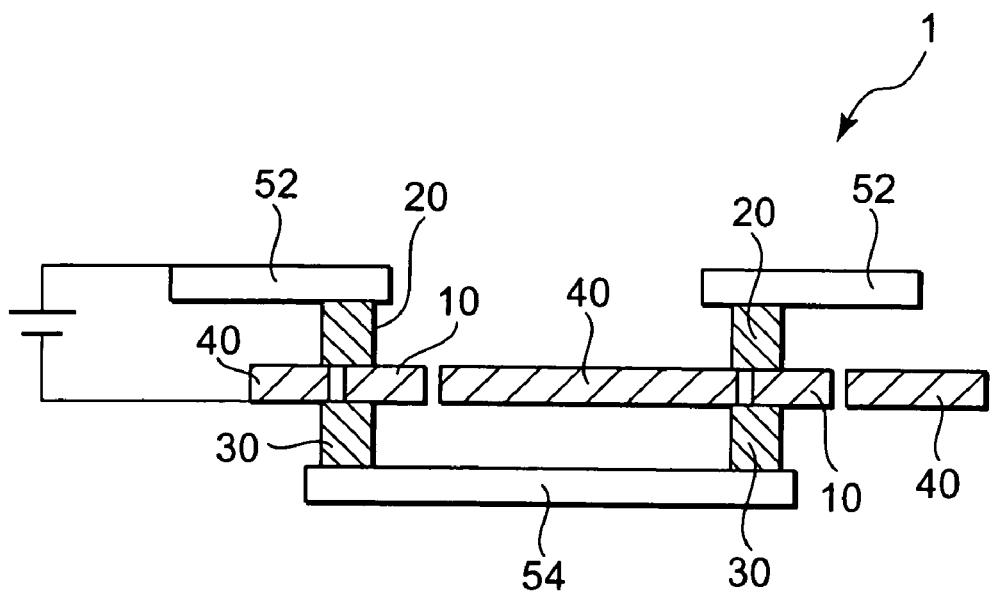

Next, a displacement detection method in a short check is described by referring to FIGS. 4A and 4B. This method includes a step of applying a voltage between the via plug 20 and the conductor 40 as shown in FIG. 4A. To be more specific, a voltage is applied between a terminal (not shown in the figure) connected to the wiring 52 and a terminal (not shown in the figure) connected to the conductor 40. In this configuration, electric resistance of a pathway including contact surfaces between the conductor 40 and the via plugs 20 and 30 is measured.

In the case where a relative displacement between the wiring 10 and the via plugs 20 and 30 exist as shown in FIG. 4B, the area of the above-described contact surfaces becomes larger. Such a change in the area appears as a change in the above-described electric resistance. Therefore, it is possible to detect a relative displacement between the wiring and the via plugs by measuring such electric resistance.

As described above, according to the present embodiment, the displacement detection pattern 1 suitable for detection of a relative displacement between a wiring and a via plug is provided. Furthermore, according to the displacement detection pattern 1, it is possible to detect a displacement between the wiring 10 and both of the via plug 20 and the via plug 30. It is also possible to detect such a displacement both in an X direction (the horizontal direction in FIG. 1) and in a Y direction (the vertical direction in FIG. 1). In the displacement detection pattern shown in FIG. 12, on the other hand, it is only possible to detect a displacement in a direction of the arrangement of the thin electrodes 102 and 104 (the vertical direction in FIG. 12).

In addition, in the present embodiment, the conductor 40 is provided so as to surround the wiring 10. Due to this configuration, it is easy to work on the wiring 10 in the production process of the semiconductor device. To be more specific, the conductor 40 serves as a dummy conductor pattern. Especially in the case where the wiring 10 is set to be the minimum-area wiring, it is difficult to form the wiring 10 if the conductor 40 is not formed. Furthermore, as explained in FIGS. 4A and 4B, the conductor 40 serves as a part of the pathway for measurement of electric resistance in the short check.

The area of the wiring 10 is larger than the areas of the via plugs 20 and 30. In such a configuration, electric resistance which is measured when no displacement exists is stabilized in the open check or in the short check. Therefore, the error in measurement can be kept small.

In the case where the distance between the wiring 10 and the conductor 40 is equal to the minimum wiring distance, it is possible to enhance the displacement detection sensitivity in the short check. It is because even a slight displacement causes contacts between the conductor 40 and the via plugs 20 and 30.

Figure 5A:
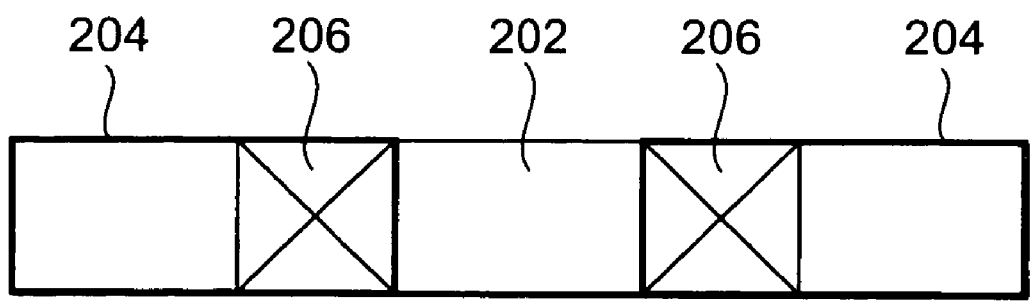
FIGS. 5A and 5B are a plan view and a cross-sectional view illustrating a displacement detection pattern according to a comparative example of the embodiment, respectively.
Figure 5B:
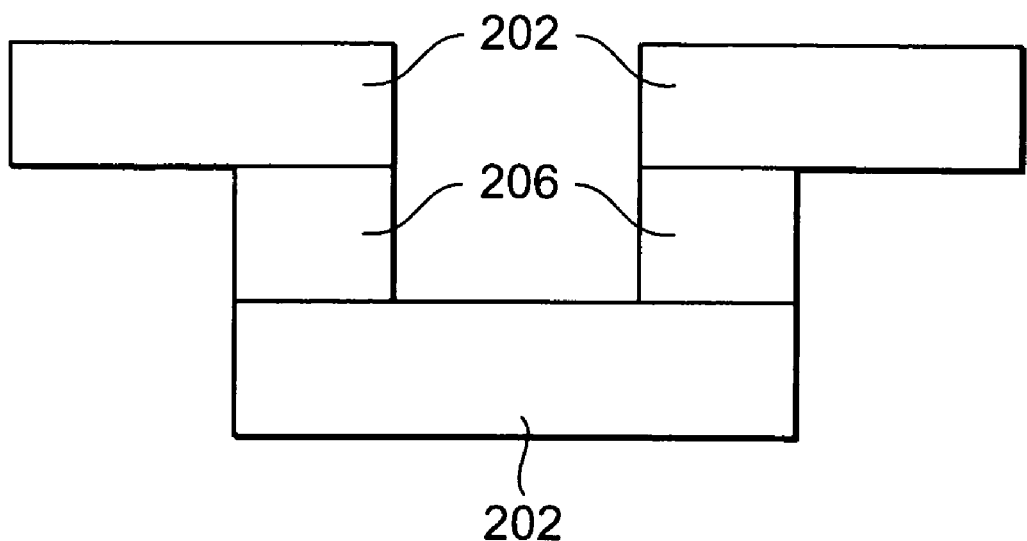

FIG. 5A and FIG. 5B are a plan view and a cross-sectional view illustrating a displacement detection pattern of a comparative example of the embodiment, respectively. A lower layer wiring 202, an upper layer wiring 204, and a via plug 206 constitute a via chain.

Figure 6A:
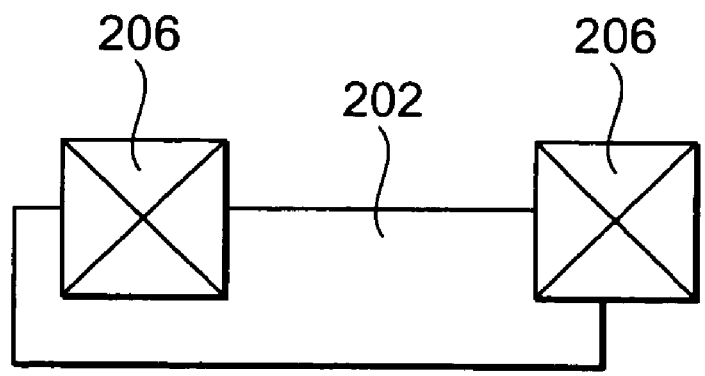
FIGS. 6A and 6B are a plan view and a cross-sectional view for describing a performance of the displacement detection pattern in FIG. 5, respectively.
Figure 6B:
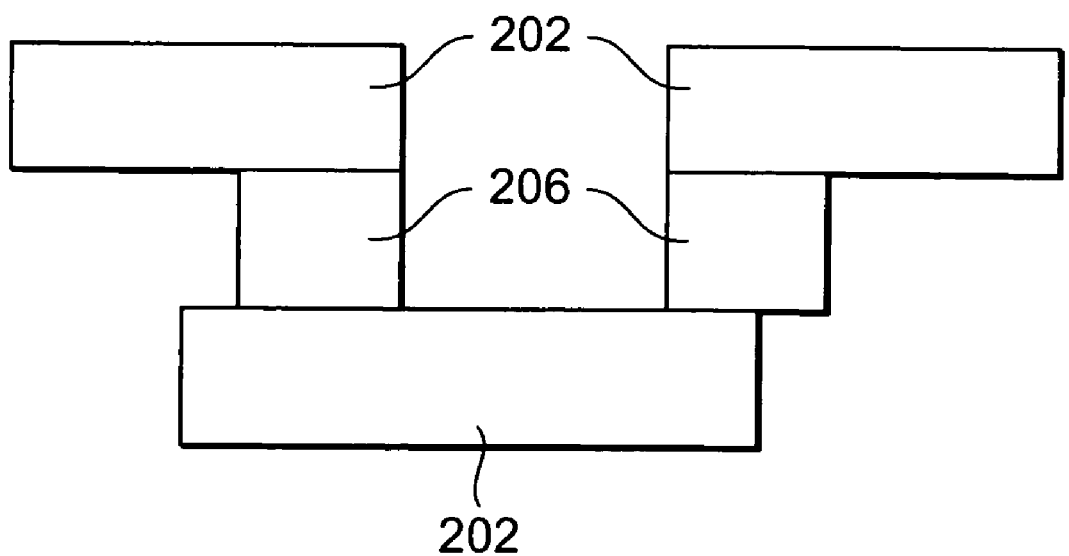

As shown in FIG. 6A and FIG. 6B, for example, when a relative displacement exists between the lower layer wiring 202 and the via plug 206, the area of the contact surface thereof becomes smaller. Therefore, it is possible to detect a displacement by measuring electric resistance of the via chain. It should be noted that the upper layer wiring 204 is omitted in FIG. 6A.

However, in this displacement detection pattern, there is a problem that a displacement and an incomplete embedding of the via plug 206 are not parameters independent from each other. In other words, in addition to the displacement, an incomplete metal embedding during the formation of the via plug 206 also contributes to a change in the electric resistance of the via chain. Therefore, it is difficult to determine the amount of displacement with high accuracy based on a measured electric resistance value.

Regarding this point, in the present embodiment, the gravity center of the wiring 10 is located at the same position as the gravity centers of the via plugs 20 and 30. To be more specific, the via plugs 20 and 30 are connected to the wiring 10 at the center thereof. In this configuration, it is less likely that an incomplete metal embedding occurs during the formation of the via plugs 20 and 30 compared to the case where the via plugs 20 and 30 are connected to the wiring 10 at the ends thereof. Accordingly, the amount of displacement can be determined with high accuracy based on a measured electric resistance value.

Second Exemplary Embodiment

FIG. 7 is a cross-sectional view illustrating a second exemplary embodiment of the displacement detection pattern according to the present invention. In a displacement detection pattern 2, the area of the wiring 10 is smaller than the areas of the via plugs 20 and 30 in a planar view. In this case as well, it is preferable that the wiring 10 be the minimum-area wiring. It is also preferable that the distance between the wiring 10 and the conductor 30 be equal to the minimum wiring distance. Other parts of the configuration of the displacement detection pattern 2 are the same as those in the displacement detection pattern 1.

Figure 8A:
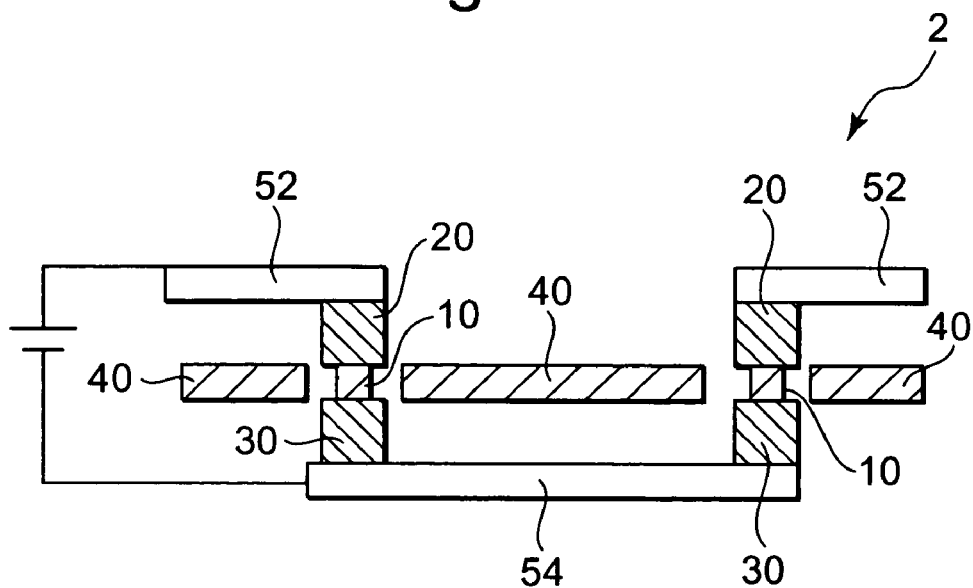
FIGS. 8A and 8B are cross-sectional views for describing a displacement detection method in the second exemplary embodiment.
Figure 8B:
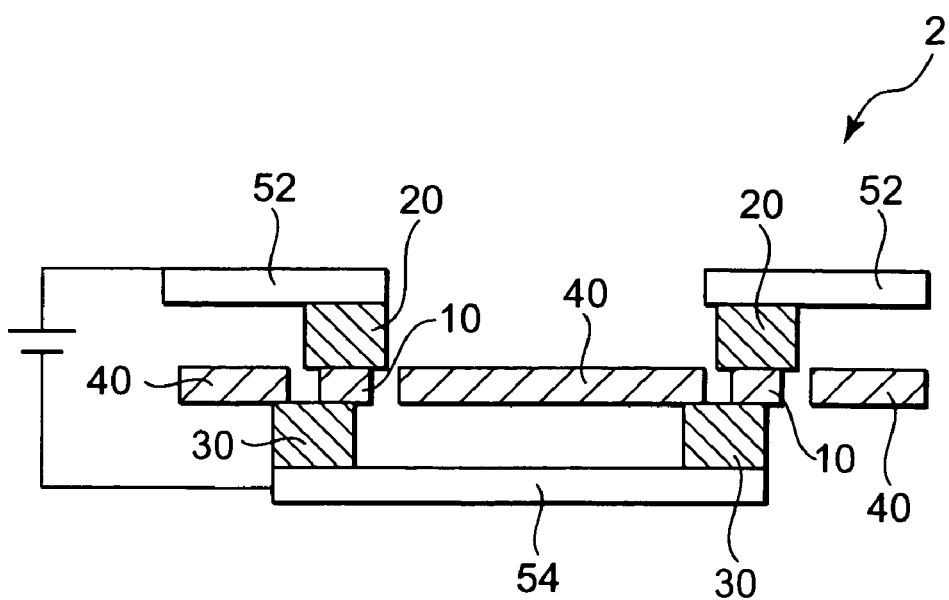
Figure 9A:
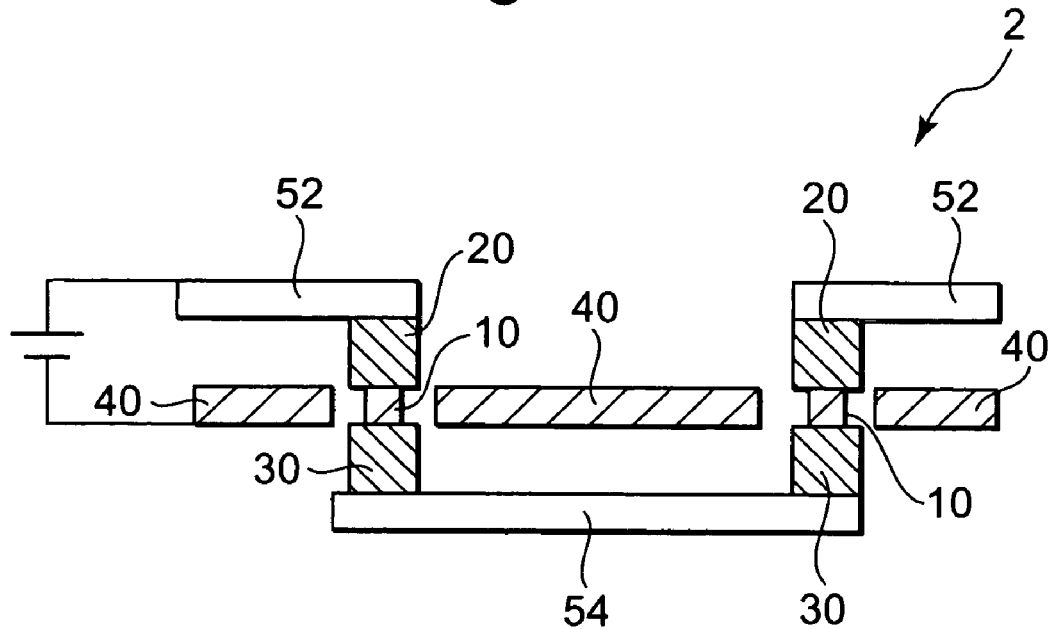
FIGS. 9A and 9B are cross-sectional views for describing the displacement detection method in the second embodiment.
Figure 9B:
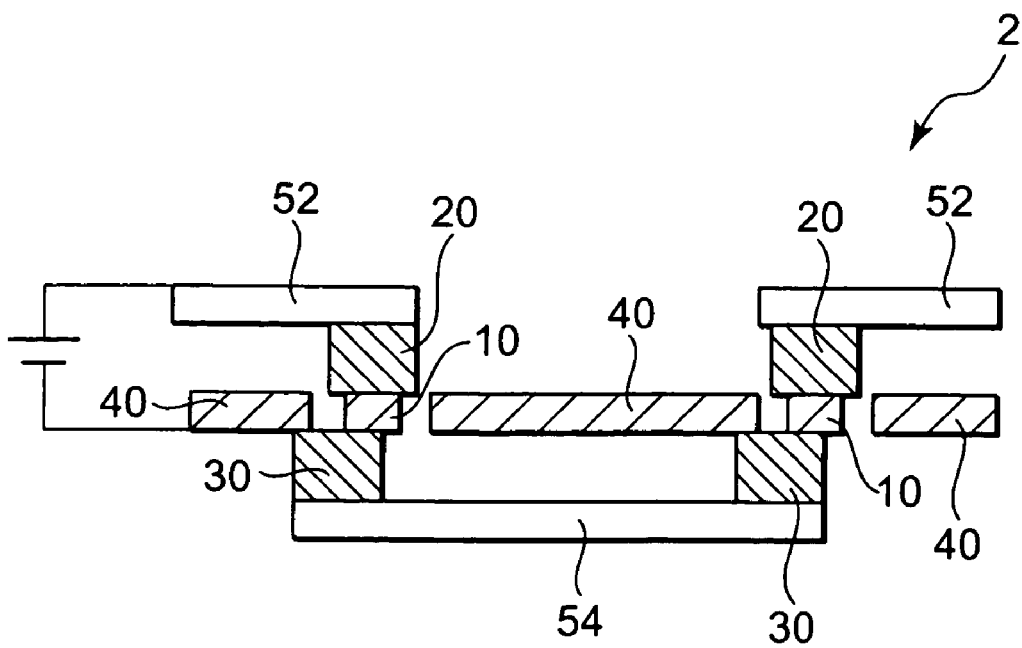

In the present embodiment as well, when a displacement detection is carried out in the open check, it is only required to apply a voltage between the via plug 20 and the via plug 30, as shown in FIG. 8A and FIG. 8B. Furthermore, when a displacement detection is carried out in the short check, it is only required to apply a voltage between the via plug 20 and the conductor 40 as shown in FIG. 9A and FIG. 9B. FIG. 8A and FIG. 9A show the state in which no displacement exists. On the other hand, FIG. 8B and FIG. 9B show the state in which a relative displacement exists between the wiring 10 and the via plugs 20 and 30.

In the present embodiment, the area of the wiring 10 is smaller than the areas of the via plugs 20 and 30. In this configuration, the distance between each of the via plugs 20 and 30 and the conductor 40 when no displacement thereamong exists can be shorter compared to the case where the area of the wiring 10 is larger than the areas of the via plugs 20 and 30. Accordingly, the displacement sensitivity can be enhanced in the short check. Other effects of the present embodiment are the same as those in the first embodiment.

Third Exemplary Embodiment

Figure 10:
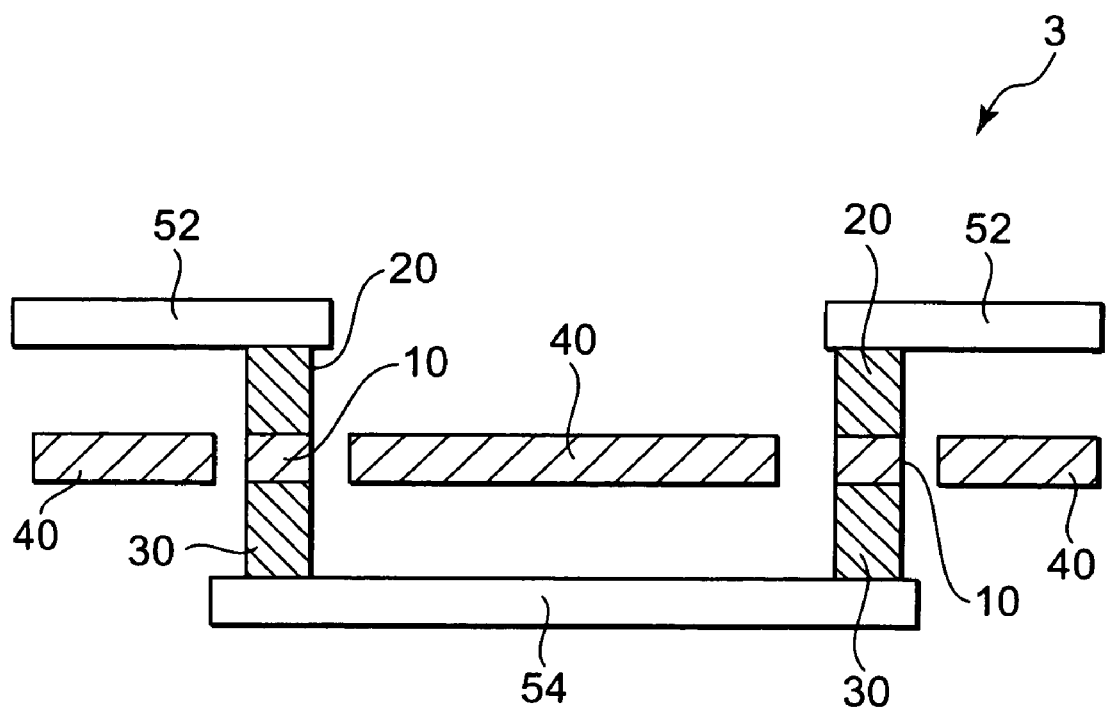
FIG. 10 is a cross-sectional view illustrating a third exemplary embodiment of the displacement detection pattern according to the present invention.

FIG. 10 is a cross-sectional view illustrating a third exemplary embodiment of the displacement detection pattern according to the present invention. In a displacement detection pattern 3, the area of the wiring 10 is equal to the areas of the via plugs 20 and 30 in a planar view. In this case as well, it is preferable that the wiring 10 be the minimum-area wiring. Furthermore, it is preferable that the distance between the wiring 10 and the conductor 40 be equal to the minimum wiring distance. Other parts of the configuration of the displacement detection pattern 3 are the same as those in the displacement detection pattern 1.

In the present embodiment, as well as in the first and second embodiments, a displacement detection can be carried out in the open check or in the short check.

In the present embodiment, the area of the wiring 10 is equal to the areas of the via plugs 20 and 30. In this configuration, it is possible to enhance the displacement sensitivity in the open check. It is because even a slight displacement causes a change in the area of the contact surface between the wiring 10 and the via plugs 20 and 30. Other effects of the present embodiments are the same as those in the first embodiment.

Figure 11A:
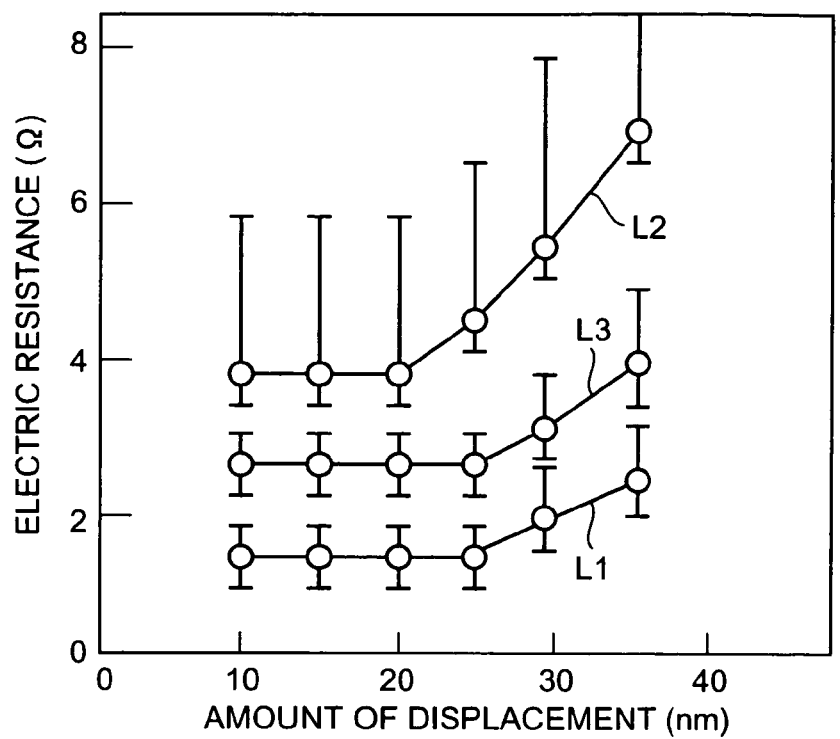
FIGS. 11A and 11B are graphs showing relationships between the amount of displacement and electric resistance measured in an open check and in a short check, respectively.
Figure 11B:
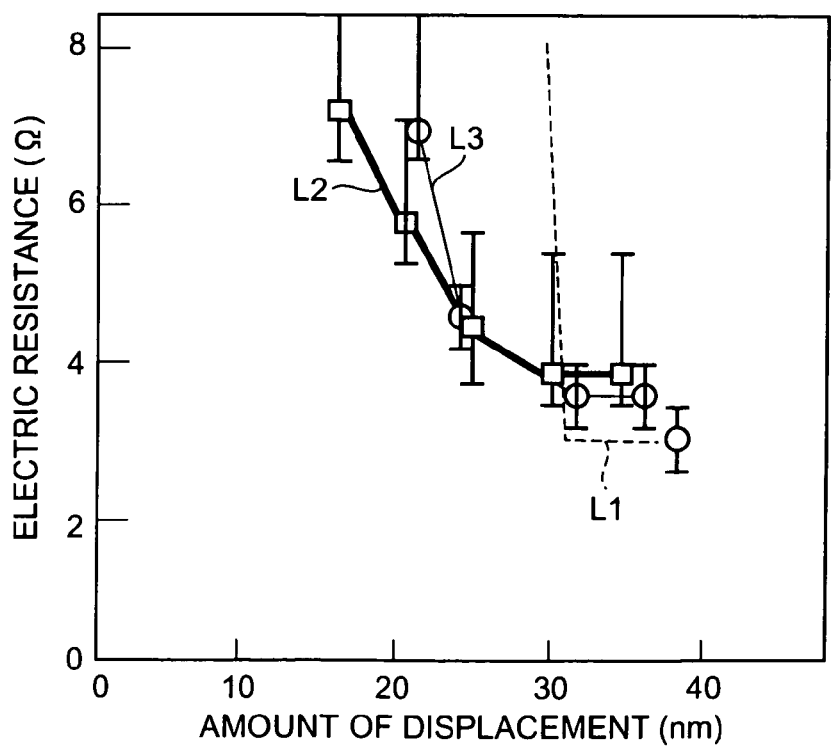

FIG. 11A and FIG. 11B are graphs showing the relationships between the amount of displacement and the electric resistance measured in the open check and in the short check, respectively. The vertical axis represents electric resistance ($\Omega$), while the horizontal axis represents the amount of displacement (nm) in the X direction or in the Y direction. In these graphs, a line L1, a line L2, and a line L3 correspond to the above-described first, second, and third embodiments, respectively. These graphs show results obtained in the case where the wiring 10 is the minimum-area wiring and the distance between the wiring 10 and the conductor 40 is the minimum wiring distance. It should be noted that, regarding the open check in the second embodiment (the line L2 in FIG. 11A), the result shown was obtained in the case where the distance between the wiring 10 and the conductor 40 is twice the minimum wiring distance.

Next, the defective determination regarding the via defect and the displacement will be described, by using a short check and an open check method, referring to FIGS. 12A, 12B, 13A, 13B, 14A and 14B.

Figure 12A:
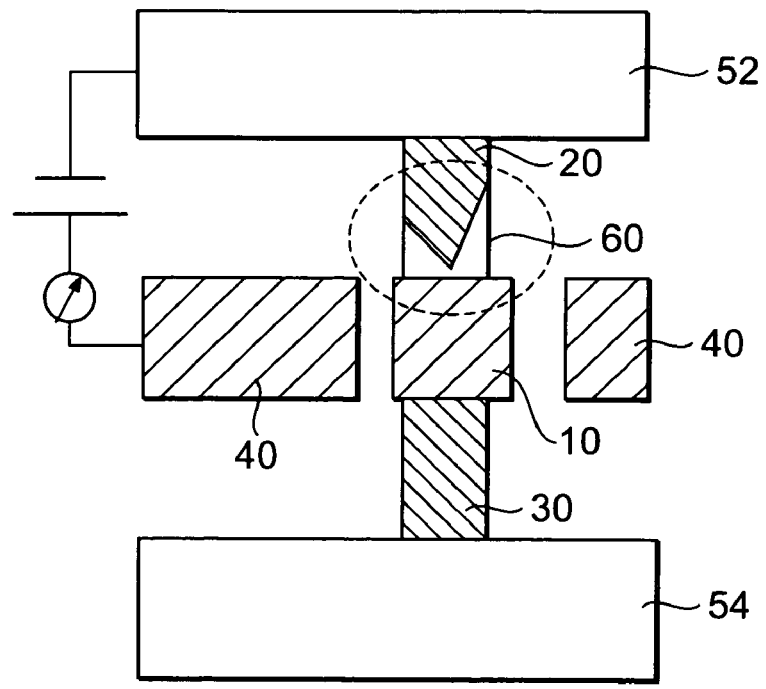
FIGS. 12A and 12B are cross-sectional views describing a way to detect a via defect.
Figure 12B:
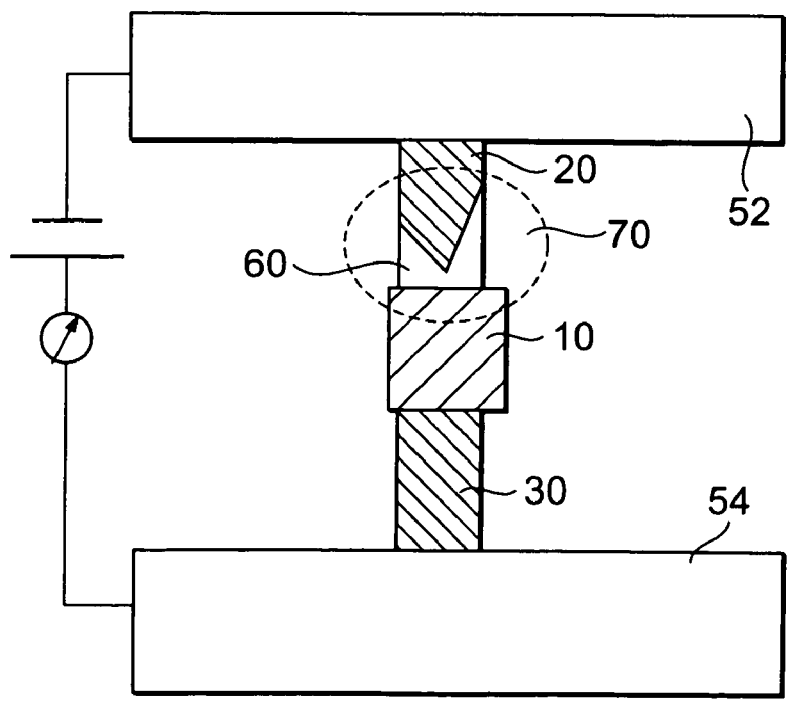

The device of FIGS. 12A and 12B has a void 60, which will cause the via detect. The short check is performed as shown in FIG. 12A and detected that this device does not have a short connection between the wires 52 and 40. The open check is conducted as shown in FIG. 12B and it is detected that the via is improperly buried, that is, the via has a void. By the tests, it will be estimated that the device has a void.

Figure 13A:
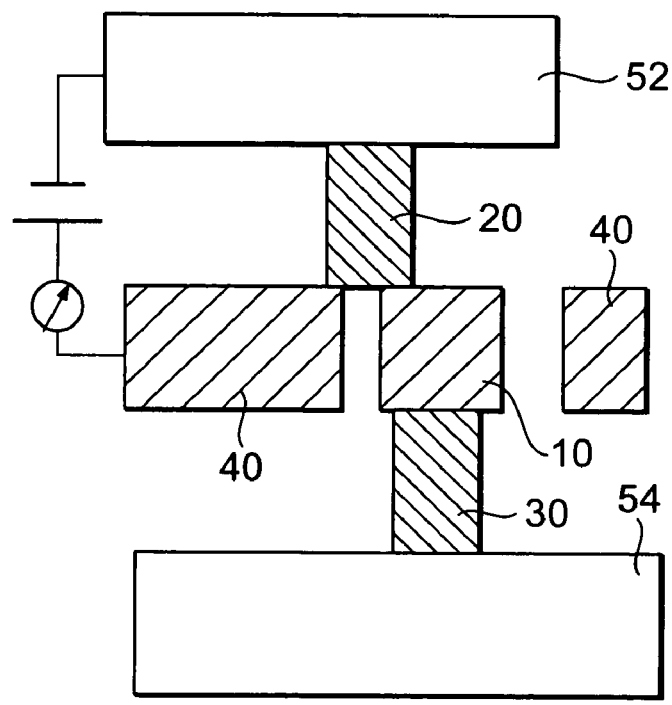
FIGS. 13A and 13B are cross-sectional views describing a way to detect displacement.
Figure 13B:
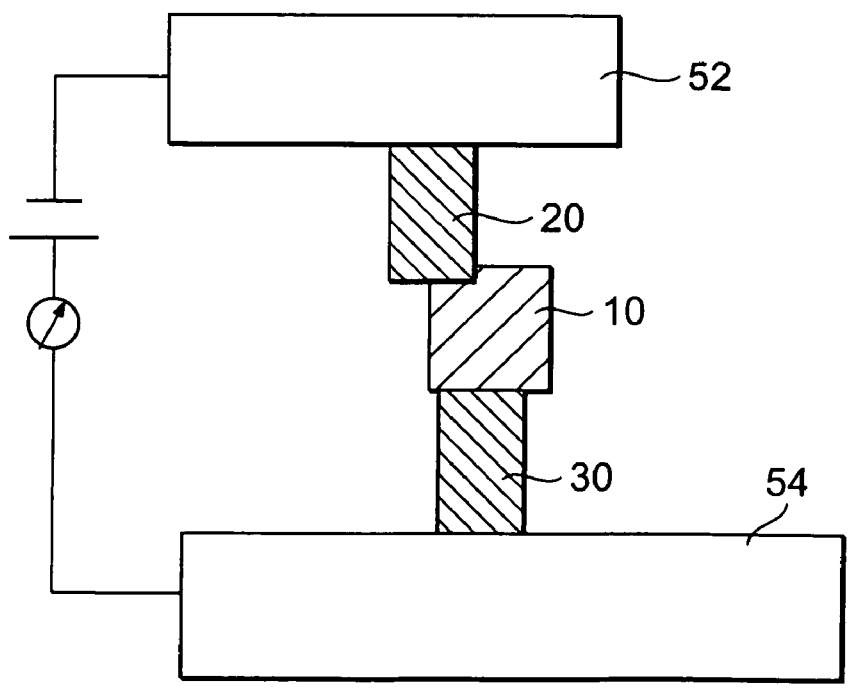

The device of FIGS. 13A and 13B has a displacement. The short check is performed as shown in FIG. 13A and detected that this device has a short connection between the wires 52 and 40. The open check is conducted as shown in FIG. 13B and detected that the via is properly buried, but, the resistance is higher than the normal state (standard resistance). By these tests, it will be estimated that the device has the displacement.

Figure 14A:
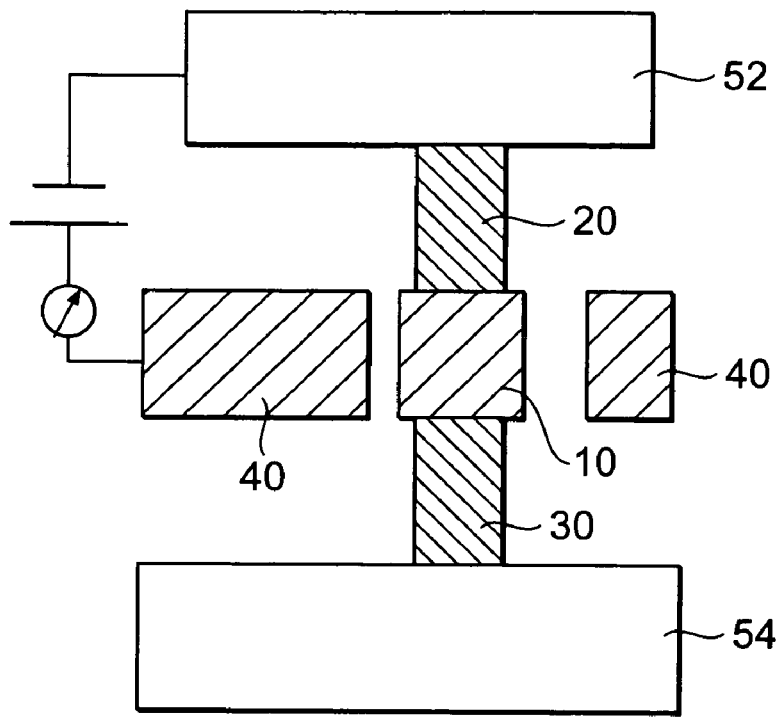
FIGS. 14A and 14B are cross-sectional views describing a way to detect a normal state which does not have the via defect or the displacement.
Figure 14B:
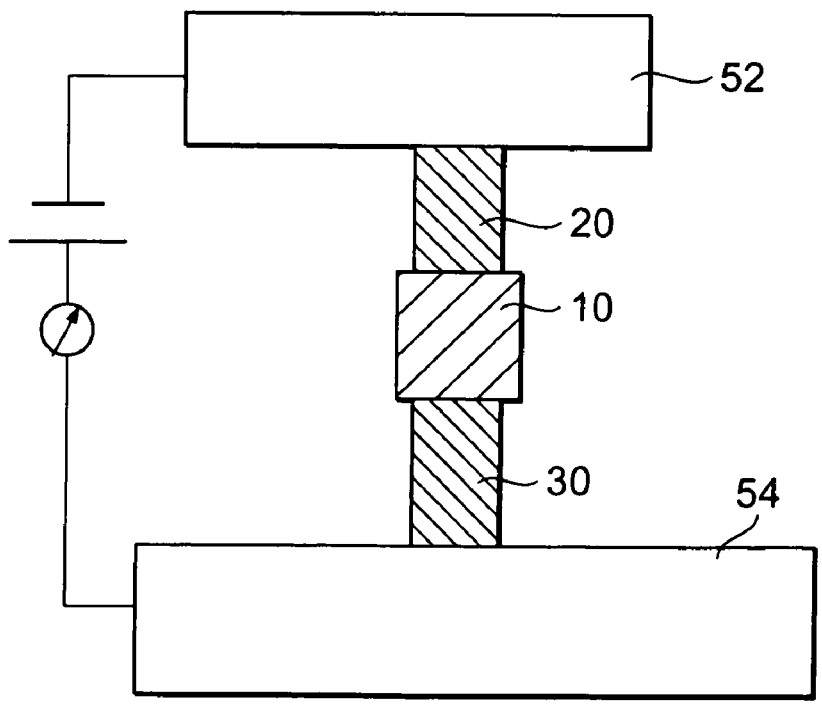
Figure 15:
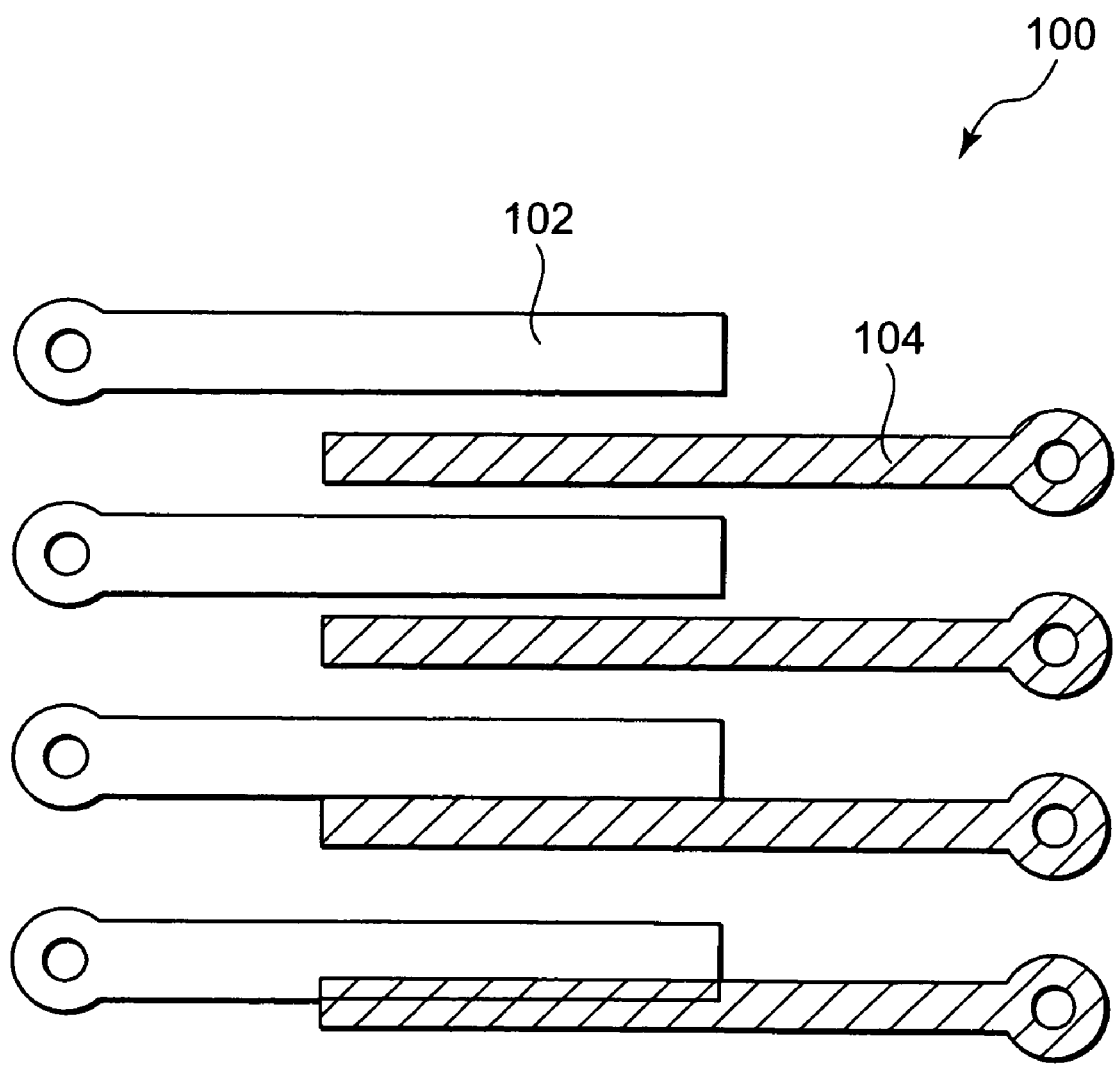
FIG. 15 is a plan view illustrating a conventional displacement detection pattern.

The device of FIGS. 14A and 14B is properly formed. The short check is performed as shown in FIG. 14A and detected that this device does not have a short connection between the wires 52 and 40. The open check is conducted as shown in FIG. 14B and detected that the via is properly buried and the resistance is the normal. By these tests, it will be estimated that the device does not have the void or the displacement, that is, the device have normally formed.

When damascene process is performed, there will be sometimes occurred a connection defect. The connection defect is required to be identified which of the via defect or displacement is caused. By performing the short check and the open check, it will be identified that the device is normal, or has via defect or displacement.

The present invention is not limited to the embodiments described above, and there may be various modifications. For example, while the example of applying a voltage between the via plug 20 and the conductor 40 in the short check is described in the above-described embodiments, a voltage may be applied between the via plug 30 and the conductor 40.

Furthermore, while the example in which multiple wirings 10 are provided is described in the above-described embodiments, the number of the wirings 10 may be one.

In addition, in the semiconductor device according to the present invention, any two of the displacement detection patterns 1, 2, and 3 may be provided at the same time, or all of the displacement detection patterns 1, 2, and 3 may be provided as well.

Further, it is noted that, Applicant's intent is to encompass equivalents of all claim elements, even if amended later during prosecution.

What is claimed is:

1. A displacement detection pattern, comprising:
a first via plug formed at a first layer level;
a second via plug formed at said first layer level;
a first wiring formed on said first via plug at a second layer level;
a second wiring formed on said second via plug at said second layer level;
a third via plug formed on said first wiring;
a fourth via plug formed on said second wiring;
a first conductor connected to said first and second via plugs; and
a second conductor formed at said second layer level to surround said first and second wirings.

2. The displacement detection pattern as claimed in claim 1, wherein an area of said third via plug facing said first wiring is smaller than an area of said first wiring.

3. The displacement detection pattern as claimed in claim 1, wherein an area of said first wiring facing said third via plug is smaller than an area of said third via plug.

4. A semiconductor device comprising a displacement detection pattern,
wherein said displacement detection pattern comprises:
a first via plug formed at a first layer level;
a second via plug formed at said first layer level;
a first wiring formed on said first via plug at a second layer level;
a second wiring formed on said second via plug at said second layer level;
a third via plug formed on said first wiring;
a fourth via plug formed on said second wiring;
a first conductor connected to said first and second via plugs; and
a second conductor formed at said second layer level to surround said first and second wirings.

5. The semiconductor device as claimed in claim 4, wherein an area of said third via plug facing said first wiring is smaller than an area of said first wiring.

6. The semiconductor device as claimed in claim 4, wherein an area of said first wiring facing said third via plug is smaller than an area of said third via plug.

* * * * *